(12) United States Patent (10) Patent No.: US 11,881,334 B1
Ren (45) Date of Patent: Jan. 23, 2024

(54) FPC CABLE AND DATA CABLE

(71) Applicant: Liming Ren, Guangdong (CN)

(72) Inventor: Liming Ren, Guangdong (CN)

( * ) Notice: Subject to any disclaimer, the term of this patent is extended or adjusted under 35 U.S.C. 154(b) by 0 days.

(21) Appl. No.: 18/315,802

(22) Filed: May 11, 2023

(30) Foreign Application Priority Data

Mar. 13, 2023 (CN) .......................... 202320524519.4

(51) Int. Cl.
*H01B 7/04* (2006.01)
*H01R 24/60* (2011.01)
*H01R 12/59* (2011.01)
*H01B 7/08* (2006.01)

(52) U.S. Cl.
CPC ............. *H01B 7/04* (2013.01); *H01B 7/0823* (2013.01); *H01R 12/592* (2013.01); *H01R 24/60* (2013.01)

(58) Field of Classification Search
None
See application file for complete search history.

(56) References Cited

U.S. PATENT DOCUMENTS

| | | | | |
|---|---|---|---|---|
| 2,187,401 A * | 1/1940 | Potter | ...................... | H01B 13/12 427/119 |
| 3,257,500 A * | 6/1966 | Rusch, Jr. | ............... | H01B 7/083 174/117 FF |
| 3,407,263 A * | 10/1968 | Miller | ................... | H01B 7/0018 174/117 FF |
| 3,440,336 A * | 4/1969 | Bogner | ................... | H10N 60/20 428/378 |
| 3,467,561 A * | 9/1969 | Waride | ................. | H02G 15/003 156/49 |
| 3,715,457 A * | 2/1973 | Teagno | ................. | H01R 4/2495 174/117 FF |
| 3,757,029 A * | 9/1973 | Marshall | ................... | H01B 7/08 174/117 FF |
| 3,914,531 A * | 10/1975 | Zell | .......................... | H01B 7/08 174/117 F |
| 4,149,026 A * | 4/1979 | Fritz | ..................... | H01B 7/0838 174/32 |
| 4,357,750 A * | 11/1982 | Ostman | ................. | H05K 3/4092 439/502 |
| 4,726,790 A * | 2/1988 | Hadjis | ................. | H01R 13/7195 333/185 |
| 5,083,238 A * | 1/1992 | Bousman | .............. | H05K 7/1441 174/268 |
| 5,516,989 A * | 5/1996 | Uedo | ...................... | H05K 1/028 174/250 |
| 7,449,639 B2 * | 11/2008 | Nair | ...................... | H01B 7/0876 174/117 FF |
| 9,215,834 B2 | 12/2015 | Cheng | | |
| 10,164,311 B2 | 12/2018 | Lee et al. | | |
| 10,199,141 B2 * | 2/2019 | Chin | ................... | H01R 13/6599 |
| 10,772,201 B2 | 9/2020 | Ni et al. | | |
| 11,410,791 B2 | 8/2022 | Bae et al. | | |
| 2007/0284127 A1 * | 12/2007 | Forbes | ................... | H01B 11/12 174/36 |

(Continued)

*Primary Examiner* — Krystal Robinson

(57) ABSTRACT

Provided are an FPC cable and a data cable. The FPC cable includes a conductor, an insulating layer and a skin, where the conductor is made of a sheet-like metal foil, and a front side and a back side of the conductor are covered with the insulating layer and are fixedly connected to form a one-piece integral body; and the one-piece integral body is coated with the skin, so that the FPC cable integrally has a flat long strip shape.

14 Claims, 11 Drawing Sheets

(56) References Cited

U.S. PATENT DOCUMENTS

| | | | |
|---|---|---|---|
| 2008/0073119 A1* | 3/2008 | Will | H01R 12/592 |
| | | | 174/70 R |
| 2010/0142204 A1* | 6/2010 | Bishop | F21K 9/27 |
| | | | 362/249.02 |
| 2014/0027153 A1* | 1/2014 | Harwath | H01B 3/443 |
| | | | 174/117 FF |
| 2020/0273603 A1* | 8/2020 | Lee | H05K 9/0088 |
| 2023/0072195 A1* | 3/2023 | Bartek | H01R 25/162 |

* cited by examiner ly in parallel; and the leads include a lead for transmitting electric energy and a lead for transmitting data.

As a preferred solution, the first connector is respectively a USB-A male plug or a type-C male plug; and the second connector is a type-C male plug or a Lightning™ interface plug. (Lightning is a trademark of Apple Inc, registered in the U.S. and other countries.)

The conductor according to the present invention is a sheet-like metal foil, and the FPC cable formed by a covering structure of the insulating layer on the sheet-like metal foil conductor has the technical effects of flexibility, ultrathinness and lightweight. Furthermore, the volume and weight of an electronic product can be reduced synchronously, thereby being suitable for the development requirements of the electronic product in the direction of high density, miniaturization and high reliability. The wide application to the fields of aerospace, military, mobile communication, laptops, computer peripherals, PDA and digital cameras, or products reduces the line space, flexibility is achieved, random arrangement is performed according to the space layout requirement, and random movement, retraction and expansion are performed in a three-dimensional space, thereby integrating component assembling and lead connection.

FPC CABLE AND DATA CABLE

TECHNICAL FIELD

The present invention relates to the technical field of FPC cables, and in particular to an FPC cable and a data cable.

BACKGROUND

An FPC cable can be applied to electronic products such as mobile phones, notebook computers, PDA, digital cameras and LCM. The FPC cable is a printed circuit that is made of a polyimide or polyester film as a base material and has high reliability and flexibility, has the characteristics of high wiring density, light weight and small thickness, has high reliability and excellent flexibility, and usually pursues convenience and lightweight. Therefore, the design of a flexible, ultra-thin and lightweight flexible circuit board has become a craze in the electronic industry. With the continuous development and progress of science and technology, the requirement on the circuit board is higher and higher, in particular, digital products.

SUMMARY

An objective of the present invention is to provide a flexible, ultra-thin and lightweight FPC cable and a data cable.

According to a first aspect of the present invention, an FPC cable is provided and includes a conductor, an insulating layer and a skin, where the conductor is made of a sheet-like metal foil, and a front side and a back side of the conductor are respectively coated with the insulating layer and are fixedly connected to form a one-piece integral piece; and an outer layer of the one-piece integral piece is coated with the skin, so that the FPC cable integrally has a flat long strip shape.

As a preferred solution, the conductor may be a single layer, two layers or multiple layers, interlayer arrangement has a gap. and a front side and a back side of each layer of conductor are respectively covered with the insulating layer and are fixedly connected to form a one-piece integral piece.

As a preferred solution, a length of a cross section of the FPC cable is more than 4 times a width of the cross section.

As a preferred solution, parts, exposed out of the insulating layer, of two ends of the conductor form bonding pads.

As a preferred solution, the FPC cable further includes an electronic component, where corresponding pins of the electronic component are connected to the bonding pads; and the electronic component is one of a chip, an LED, a resistor and a capacitor.

As a preferred solution, the conductor is made of a sheet-like copper foil, a constantan alloy foil or a gold foil; and the insulating layer is a PI film, and the conductor is fixed to the corresponding insulating layer through a viscose glue.

As a preferred solution, a length of a cross section of the one-piece integral piece formed by the conductor and the insulating layer has a length of 6 to 7 mm and a width of 0.2 to 0.4 mm.

According to a second aspect of the present invention, a data cable is provided and includes the FPC cable according to the first aspect, and a first connector and a second connector which are respectively connected to two ends of the FPC cable.

As a preferred solution, the conductor is several leads which are insulated from each other and arranged corre-

BRIEF DESCRIPTION OF THE DRAWINGS

The drawings of the specification that constitutes a part of the present application are used to provide a further understanding of the present invention. The exemplary embodiments of the present invention and the description thereof are used to explain the present invention, and do not constitute an improper limitation of the present invention. In the drawings.

DETAILED DESCRIPTION OF THE EMBODIMENTS

Figure 1:
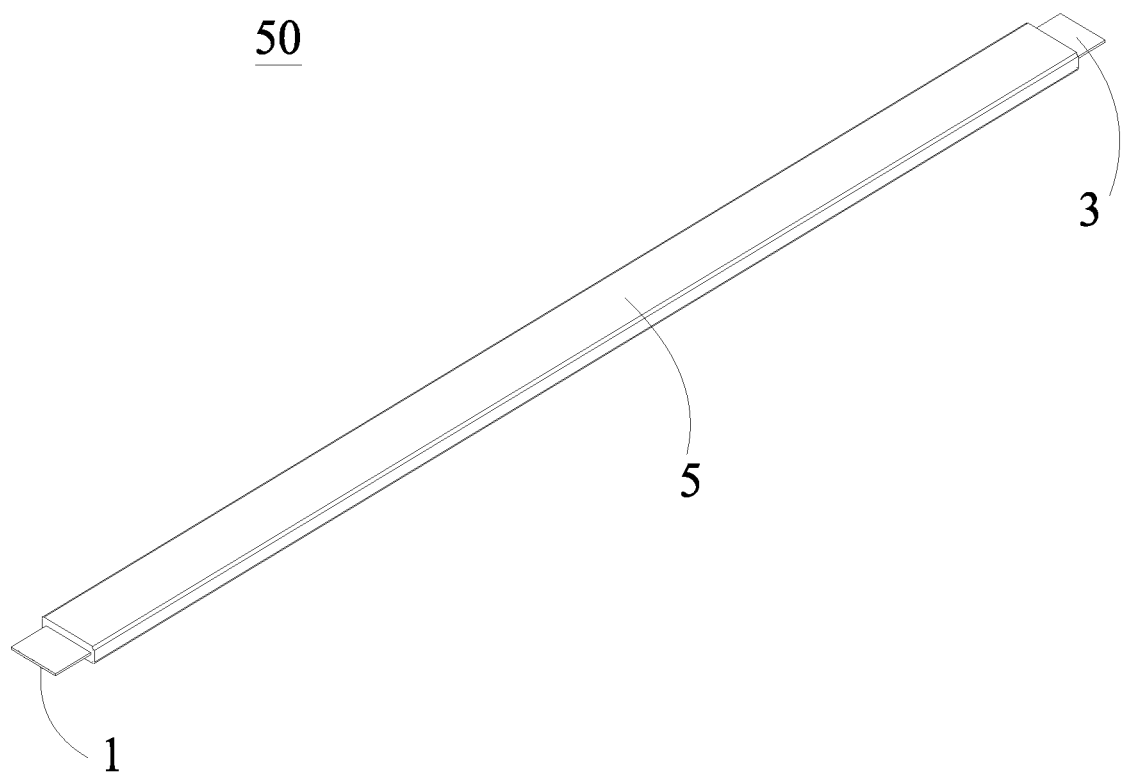
FIG. 1 is a three-dimensional schematic diagram of an FPC cable according to Embodiment 1 of the present invention.

The present invention is described in detail below with reference to the accompanying drawings and embodiments.

Each example is provided to explain the present invention instead of limiting the present invention. In fact, those skilled in the art will appreciate that modifications and variations may be made in the present invention without departing from the scope or spirit of the present invention. For example, features shown or described as one part of one embodiment may be applied to another embodiment to generate yet another embodiment. Therefore, it is expected that the present invention includes such modifications and variations that fall within the scope of the appended claims and their equivalents.

In the description of the present invention, orientation or position relationships indicated by terms "longitudinal", "transverse", "upper", "lower", "front", "rear", "left", "right", "vertical", "horizontal", "top", "bottom" and the like are orientation or position relationships shown in the drawings, and these terms are merely for facilitating description of the pre sent invention, but not for requiring that the present invention must be constructed and operated in a specific orientation, and thus, these terms cannot be understood as a limitation to the present invention. As used in the present invention, the terms "connected", "connection" and "set" should be understood in a broad sense, for example, they may be fixed connection or detachable connection, they may be direct connection or indirect connection through an intermediate part; or they may be wired connection and wireless connection, or may be connection through a wireless communication signal. For those of ordinary skill in the field, the specific meanings of the terms may be understood according to the specific conditions.

The accompanying drawings show one or a plurality of examples of the present invention. The detailed description uses reference numerals and letters to refer to the features in the accompanying drawings. Similar numeral references in the drawings and description have been used to refer to the similar parts in the present invention. As used herein, the terms "first", "second" and "third" are used interchangeably to distinguish one component from another component, and are not intended to indicate the position or importance of individual components.

Embodiment 1

Figure 2:
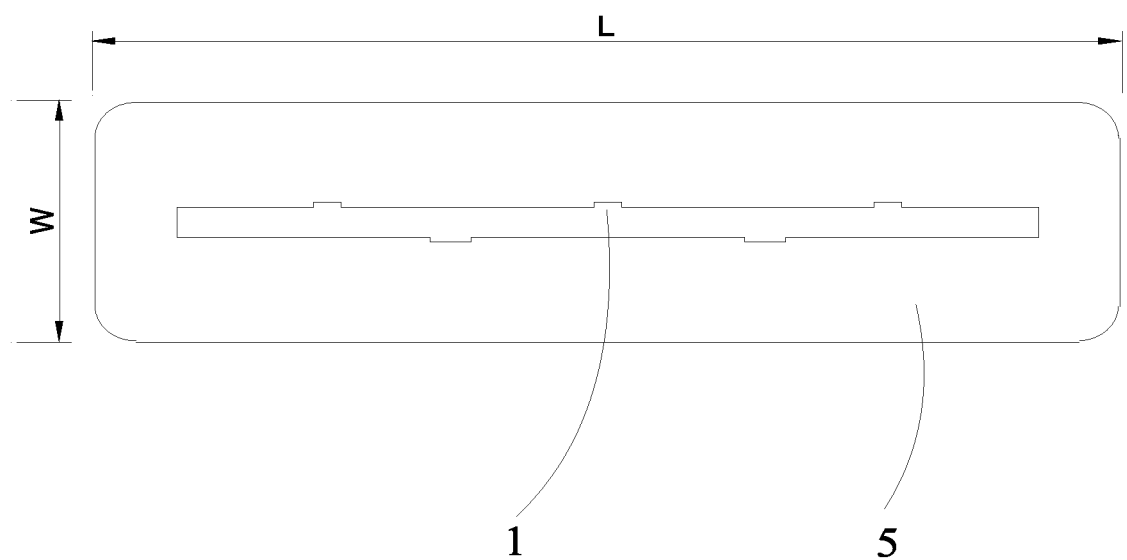
FIG. 2 is a side schematic diagram of the FPC cable shown in FIG. 1.
Figure 3:
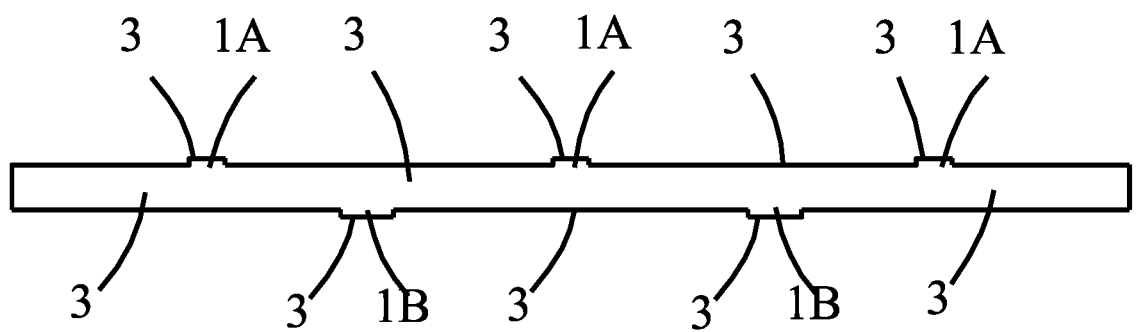
FIG. 3 is a side schematic diagram of the FPC cable shown in FIG. 1 with a skin removed.

As shown in FIG. 1 to FIG. 3, according to embodiments of the present invention, an FPC cable 50 is provided and includes a conductor 1, an insulating layer 3 and a skin 5. The conductor 1 is coated with the insulating layer 3, and the insulating layer 3 is coated with the skin 5. The conductor 1 is made by removing an unnecessary part from a sheet-like metal foil. The plane graph of the conductor 1 may be of a regular shape such as a strip shape, or may be an irregular shape. A front side and a back side of the conductor 1 are covered with the insulating layer 3 and are fixedly connected to form a one-piece integral piece, as shown in FIG. 3. The one-piece integral piece is coated with the skin 5. The FPC cable 50 integrally has a flat long strip shape. Therefore, a flexible, ultra-thin and lightweight FPC cable 50 is formed.

Further, the number of arrangement layers of the conductor 1 is set according to requirements. Specifically, the number of arrangement layers of the conductor 1 includes one, two or more. In this embodiment, the number of layers is two, and the conductor 1 includes several first layers of conductors 1A and several second layers of conductors 1B. A front side and a back side of each layer of conductor are respectively covered with the insulating layer 3 and are fixedly connected to form a one-piece integral piece.

Referring to FIG. 2, specifically, a length L of a cross section of the FPC cable 50 is more than 4 times a width W of the cross section. It may be understood that a covering thickness of the skin 5 can further reduce the length L and the width W of the cross section of the FPC cable 50, and the FPC cable 50 can be thinner and more lightweight.

Referring to FIG. 1 and FIG. 2, in this embodiment, the conductor 1 is a strip or sheet made by removing an unnecessary part from a sheet-like copper foil, a constantan alloy foil or a gold foil. The insulating layer 3 is a PI film. The conductor 1 is fixedly connected to the corresponding insulating layer 3 through a viscose glue.

Referring to FIG. 3, in this embodiment, the conductor 1 is two layers, respectively a first layer of conductor 1A and a second layer of conductor 1B. It may be understood that the first layer of conductor 1A and the second layer of conductor 1B may be respectively made of metal foils of different materials. For example, as shown in FIG. 3, the first layer of conductor 1A is a sheet-like copper foil, and the second layer of conductor 1B is a constantan alloy foil in this way, the FPC cable 50 has more optimized use performance based on ultrathinness and lightweight.

Figure 4:
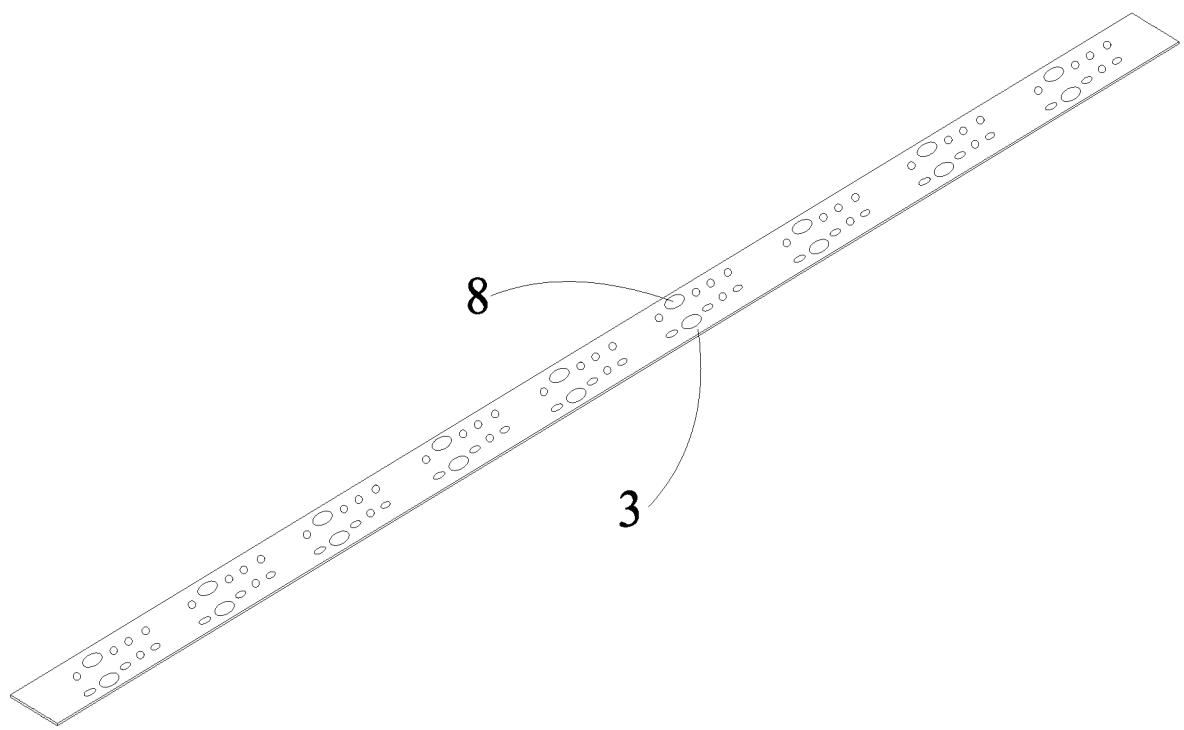
FIG. 4 is a schematic diagram of a one-piece integral body formed by a conductor and an insulating layer of the FPC cable shown in FIG. 1 with a skin removed.

Referring to FIG. 4, in this embodiment, the conductor 1 is partially exposed out of the insulating layer 3 to form a bonding pad 8. The bonding pad 8 may be a bonding pad group arranged regularly to facilitate the accurate location of required welding in the production process and improve the production efficiency.

Figure 5:
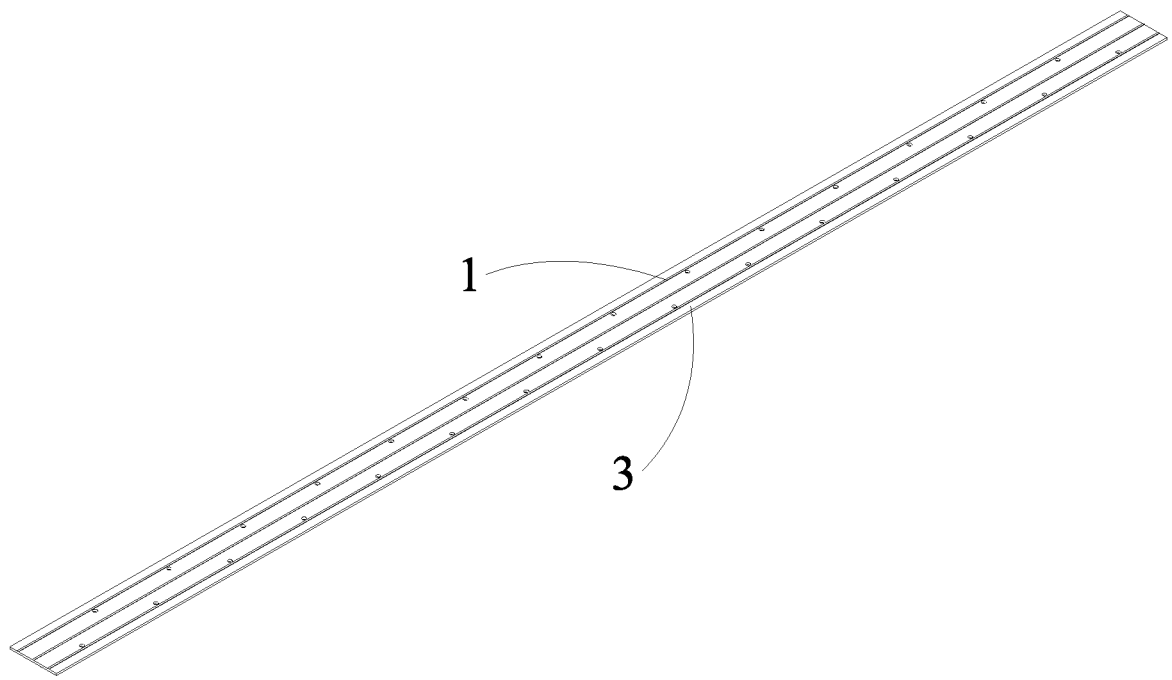
FIG. 5 is a perspective schematic diagram of a one-piece integral body formed by a conductor and an insulating layer of the FPC cable shown in FIG. 4 with a skin removed.

Referring to FIG. 3 and FIG. 5, the conductor 1 and the insulating layer 3 form a one-piece integral piece, and a cross section of the one-piece integral piece has a length of 6 to 7 mm and a width of 0.2 to 0.4. It may be understood that the smaller the covering thickness of the skin 5 is, the closer the length of the cross section of the FPC cable 50 is to 6 to 7 mm and the closer the width is to 0.2 to 0.4 mm, so that the ultrathinness and the lightweight of the FPC cable 50 are maximized.

Figure 6:
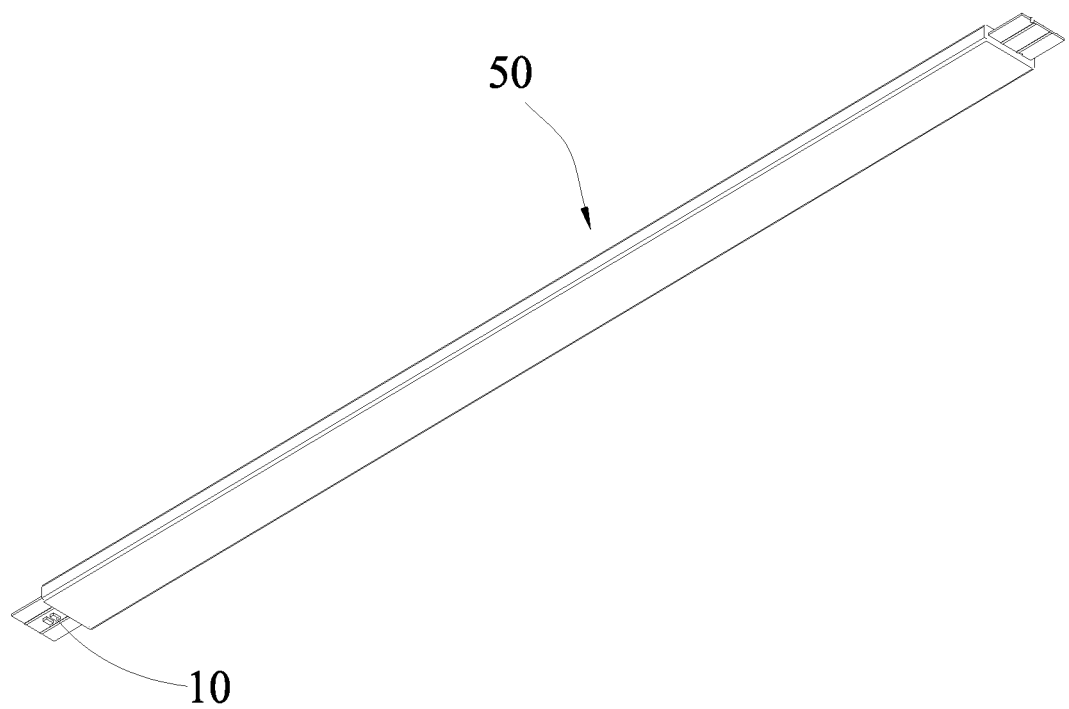
FIG. 6 is a three-dimensional schematic diagram of another FPC cable according to Embodiment 1 of the present invention.
Figure 7:
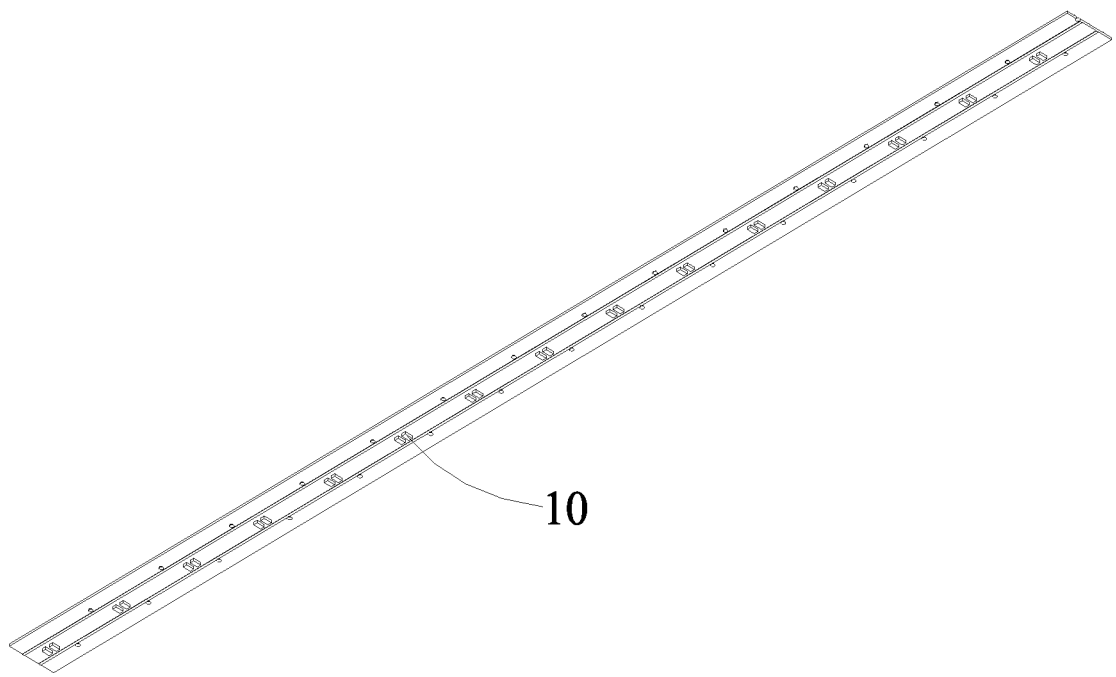
FIG. 7 is a perspective schematic diagram of a one-piece integral body formed by a conductor and an insulating layer of the FPC cable shown in FIG. 6 with a skin removed.

Referring to FIG. 6 and FIG. 7, in other embodiments, the FPC cable 50 further includes an electronic component 10.

The electronic component 10 is optionally a chip, an LED, a resistor or a capacitor. According to the specific use function of the FPC cable 50, the specific electronic component 10 is selected to be connected to the conductor 1. For example, as shown in FIG. 7, the LED is connected to the conductor 1, so that the FPC cable 50 has a light-emitting function. The resistor is connected to the conductor 1, then the FPC cable 50 has a current-limiting or shunting function. Specifically, a corresponding pin of the electronic component 10 is connected to the bonding pad 8. It may be understood that in an FPC cable 50 not provided with a bonding pad 8, the pin of the electronic component 10 may pass through the insulating layer 3 to be connected to the conductor 1, or the pin of the electronic component 10 may pass through the skin 5 and the insulating layer 3 to be connected to the conductor 1. That is, the electronic component 10 may be connected to the conductor 1 on a surface of the insulating layer 3, or may be connected to the conductor 1 on an outer surface of the skin 5.

Embodiment 2

Figure 8:
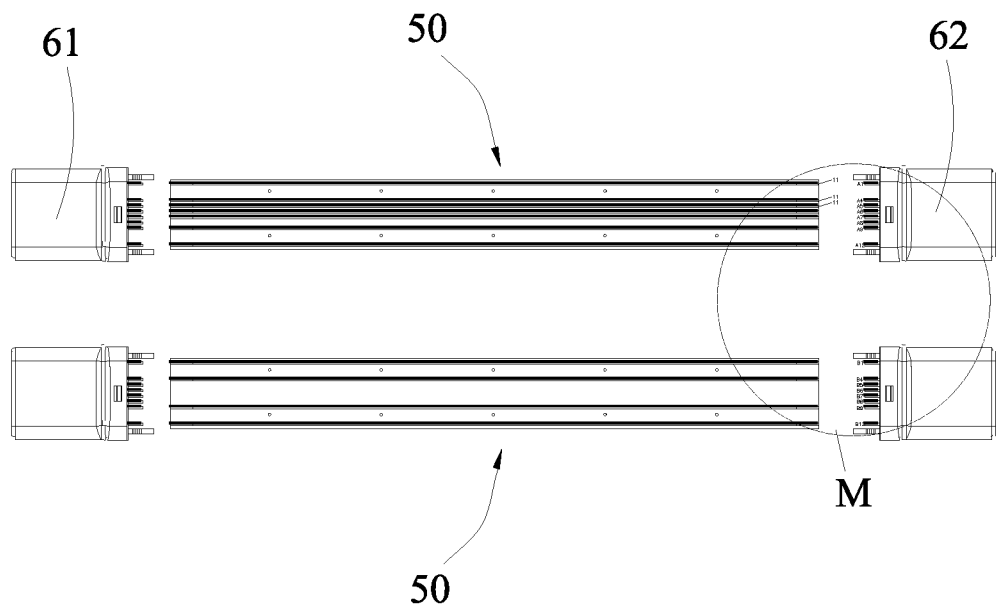
FIG. 8 is a perspective exploded schematic diagram of a front side and a back side of a data cable according to Embodiment 2 of the present invention.
Figure 9:
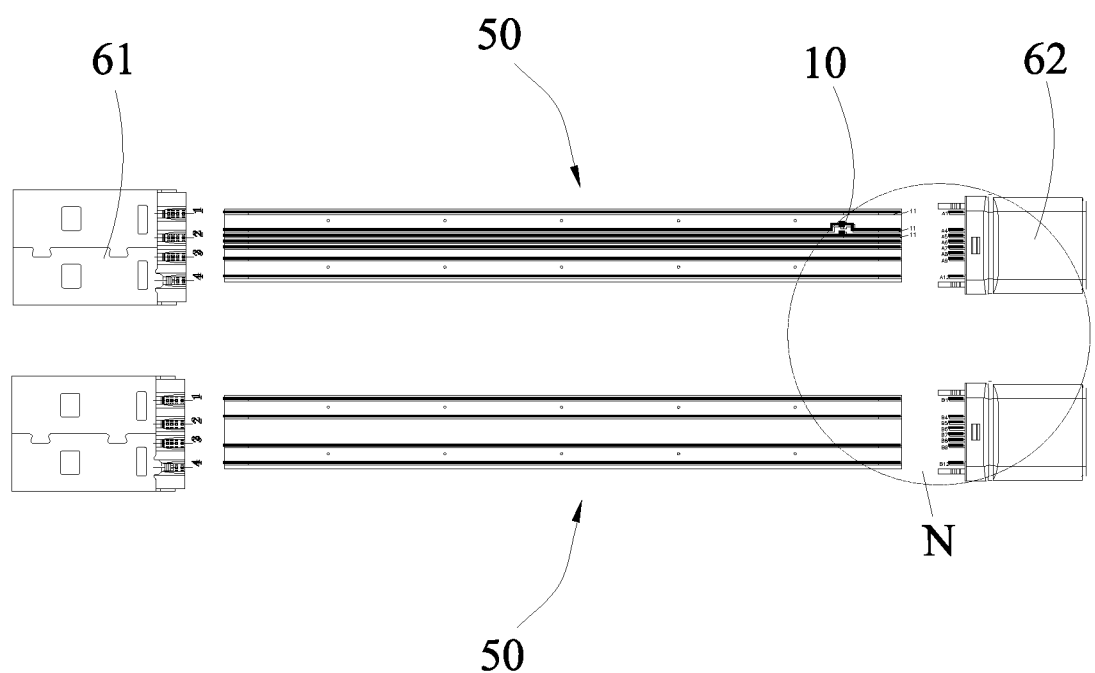
FIG. 9 is a perspective exploded schematic diagram of a front side and a back side of another data cable according to Embodiment 2 of the present invention.

Referring to FIG. 8 and FIG. 9, the present invention further provides a data cable 100, including the FPC cable 50 in Embodiment 1, and a first connector 61 and a second connector 62 which are respectively connected to two ends of the FPC cable 50.

Specifically, the first connector 61 is respectively a USB-A male plug or a type-C male plug. The second connector 62 is a type-C male plug or a Lightning™ interface plug.

In this way, the two ends of the FPC cable 50 may be respectively connected to the type-C male plug and the type-C male plug (as shown in FIG. 8), the USB-A male plug and the type-C male plug, and as shown in FIG. 9, the type-C male plug and the Lightning™ interface plug or the USB-A male plug and the Lightning™ interface plug.

Figure 10:
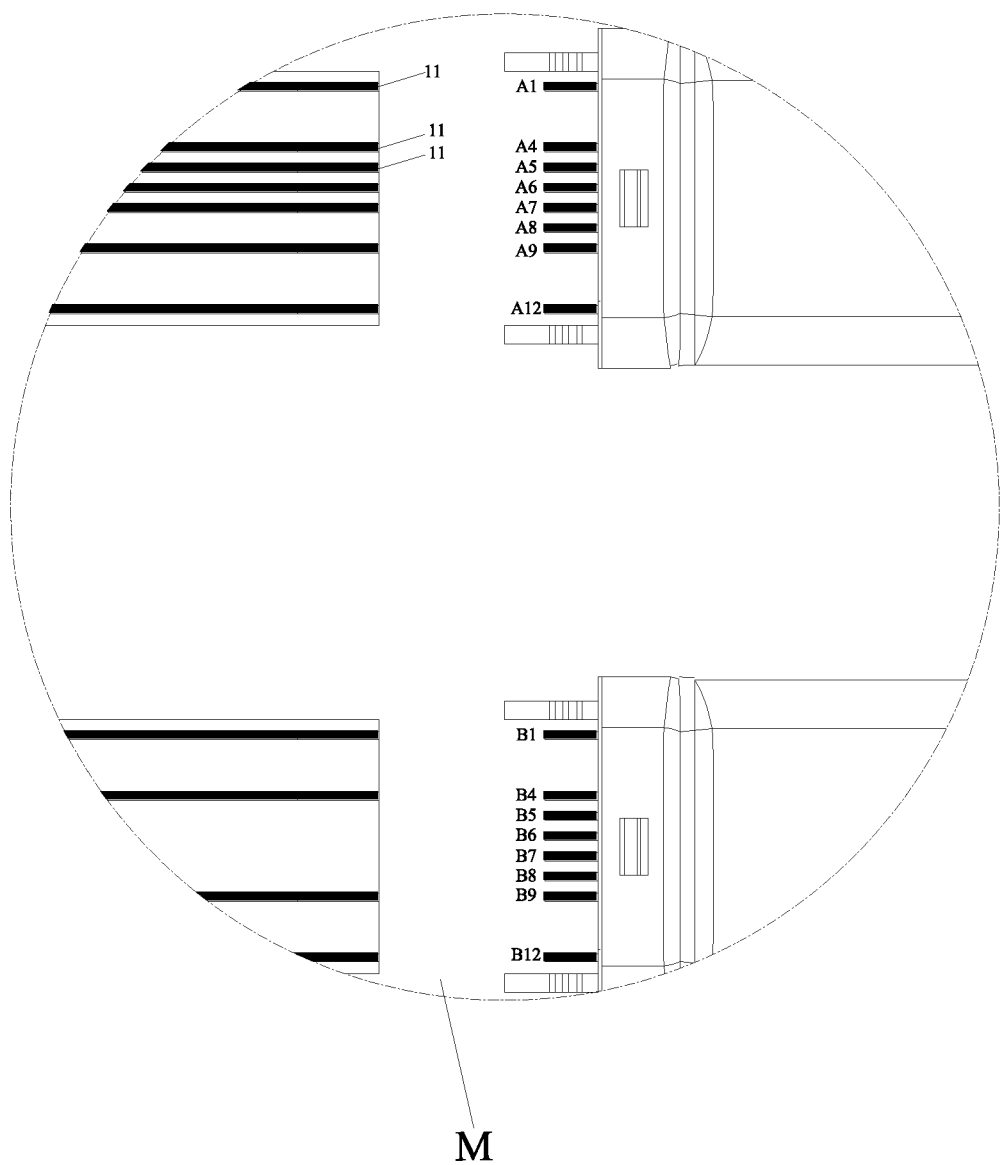
FIG. 10 is a partial enlarged view of a place M in FIG. 8.
Figure 11:
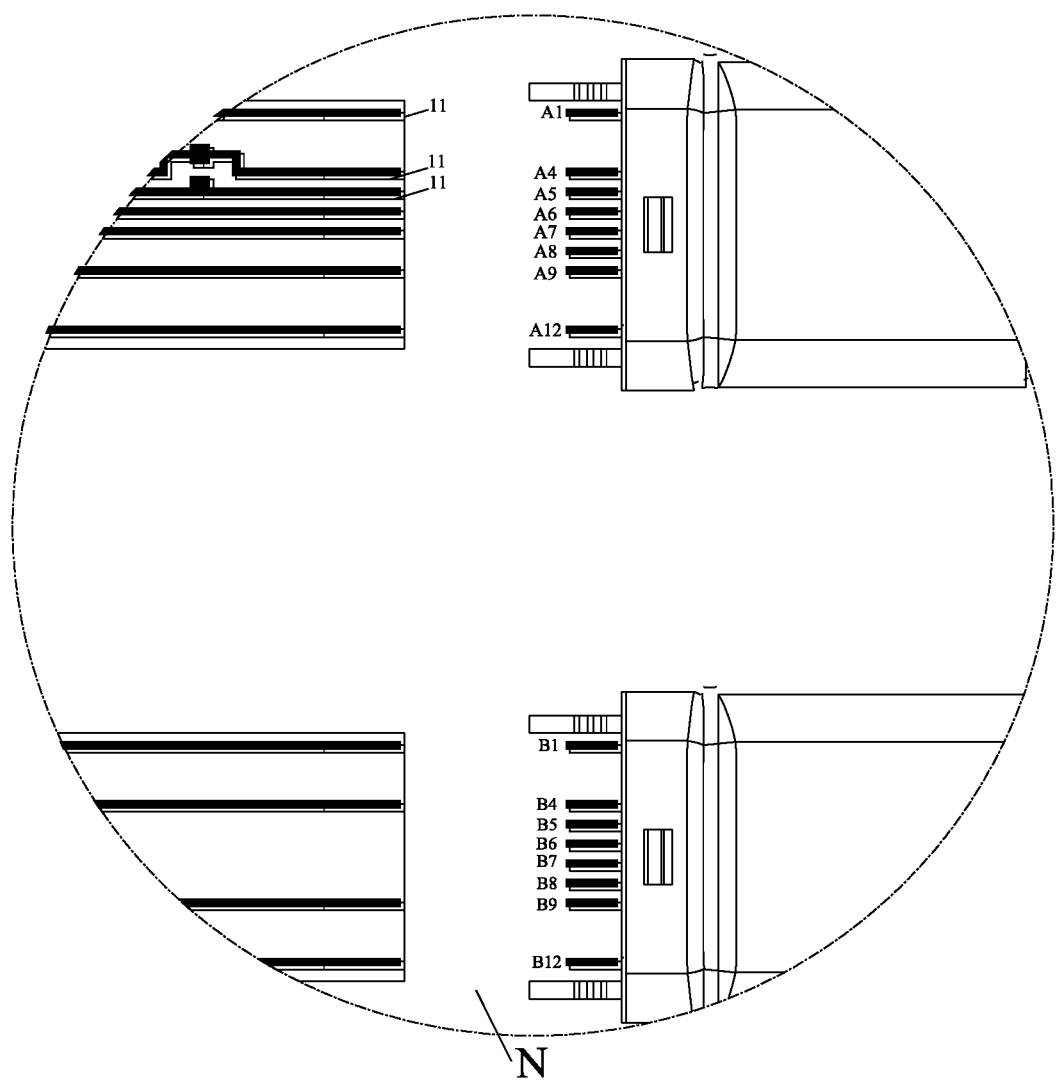
FIG. 11 is a partial enlarged view of a place N in FIG. 9.

Referring to FIG. 10 and FIG. 11, the conductor 1 further forms several leads 11 insulated from each other, and the leads 11 include a lead for transmitting electric energy and a lead for transmitting data. For example: as shown in FIG. 8, the leads 11 correspondingly connected to the pins A5, A6, A7 and A8 in the second connector 62 of the type-C male plug are leads for transmitting data; and the leads 11 correspondingly connected to the remaining pins A1, A4, A9, A12, B1, B4, B9 and B12 are leads for transmitting electric energy. Specifically, the functions of the leads 11 may be designed according to the transmission requirements. For example, as shown in FIG. 9, the lead of the corresponding pin A4 in the second connector 62 is provided with an electronic component 10 of a resistor with a current-limiting function, so that the data cable is adapted to the used electronic products.

Several variations and improvements may be made by those of ordinary skill in the art without departing from the conception of the present invention, but such variations and improvements should fall within the protection scope of the present invention. Therefore, the patent protection scope of the present invention should be subject to the appended claims.

The above is merely illustrative of the preferred embodiments of the present invention and is not intended to limit the present invention, and various changes and modifications may be made by those skilled in the art. Any modifications, equivalent substitutions, improvements, etc. made within the spirit and scope of the present invention should be included within the protection scope of the present invention.

What is claimed is:
1. An FPC cable, comprising
 a conductor,
 an insulating layer and
 a skin, wherein
 the conductor is made of a sheet-like metal foil, and a front side and a back side of the conductor are respectively covered with the insulating layer and are fixedly connected to form a one-piece integral body; and
 an outer layer of the insulating layer is coated with the skin, so that the FPC cable integrally has a flat long strip shape;
 wherein the conductor is made of a sheet-like copper foil, a constantan alloy foil or a gold foil; and
 the insulating layer is a PI film, and the conductor is fixed to the corresponding insulating layer through a viscose glue.
2. The FPC cable according to claim 1,
 wherein the conductor is a single layer, two layers or multiple layers; and a front side and a back side of each layer of conductor are respectively covered with the insulating layer and are fixedly connected to form a one-piece integral piece.
3. The FPC cable according to claim 1,
 wherein a length of a cross section of the FPC cable is more than 4 times a width of the cross section.
4. The FPC cable according to claim 1,
 wherein parts, exposed out of the insulating layer, of two ends of the conductor form bonding pads.
5. The FPC cable according to claim 4,
 further comprising an electronic component, wherein corresponding pins of the electronic component are connected to the bonding pads; and the electronic component is one of a chip, an LED, a resistor and a capacitor.
6. The FPC cable according to claim 1,
 wherein a length of a cross section of the one-piece integral piece formed by the conductor and the insulating layer has a length of 6 to 7 mm and a width of 0.2 to 0.4 mm.
7. A data cable,
 comprising an FPC cable, and a first connector and a second connector which are respectively connected to two ends of the FPC cable, wherein the FPC cable comprises a conductor, an insulating layer and a skin;
 the conductor is made of a sheet-like metal foil, and a front side and a back side of the conductor are respectively coated with the insulating layer and are fixedly connected to form a one-piece integral piece; and
 an outer layer of the insulating layer is coated with the skin, so that the FPC cable integrally has a flat long strip shape;
 wherein the conductor is made of a sheet-like copper foil, a constantan alloy foil or a gold foil; and
 the insulating layer is a PI film, and the conductor is fixed to the corresponding insulating layer through a viscose glue.
8. The data cable according to claim 7,
 wherein the conductor is arranged in multiple layers, and a front side and a back side of each layer of conductor are coated with the insulating layer and are fixedly connected to form a one-piece integral piece; and
 the conductor is several leads insulated from each other, and the leads comprise a lead for transmitting electric energy and a lead for transmitting data.
9. The data cable according to claim 8,
 wherein parts, exposed out of the insulating layer, of two ends of the conductor form bonding pads.
10. The data cable according to claim 9,
 wherein the FPC cable further comprises an electronic component, corresponding pins of the electronic component being connected to the bonding pads, and the electronic component being one of a chip, an LED, a resistor and a capacitor.
11. The data cable according to claim 7,
 wherein a length of a cross section of the FPC cable is more than 4 times a width of the cross section.
12. The data cable according to claim 7,
 wherein a length of a cross section of the one-piece integral piece formed by the conductor and the insulating layer has a length of 6 to 7 mm and a width of 0.2 to 0.4 mm.
13. The data cable according to claim 7,
 wherein the first connector is respectively a USB-A male plug or a type-C male plug.
14. The data cable according to claim 7,
 wherein the second connector is respectively a type-C male plug or a Lightning™ interface plug.

* * * * *